(12) United States Patent
Yang

(10) Patent No.: US 8,278,770 B2
(45) Date of Patent: Oct. 2, 2012

(54) OVERLAY MARK

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 841 days.

(21) Appl. No.: 11/945,066

(22) Filed: Nov. 26, 2007

(65) Prior Publication Data

US 2009/0134531 A1    May 28, 2009

(51) Int. Cl.
   *H01L 23/544* (2006.01)
(52) U.S. Cl. ................. 257/797; 257/E23.179
(58) Field of Classification Search ............ 257/797, 257/E23.179; 438/401, 462, 975, 973
See application file for complete search history.

(56) References Cited

U.S. PATENT DOCUMENTS

| | | | |
|---|---|---|---|
| 5,266,511 A * | 11/1993 | Takao | 438/401 |
| 5,919,714 A | 7/1999 | Chen et al. | |
| 6,118,185 A | 9/2000 | Chen et al. | |
| 6,172,409 B1 | 1/2001 | Zhou | |
| 6,376,924 B1 * | 4/2002 | Tomita et al. | 257/797 |
| 6,395,617 B2 | 5/2002 | Ando | |
| 6,649,484 B2 | 11/2003 | Ohsaki | |
| 6,778,275 B2 | 8/2004 | Bowes | |
| 6,819,426 B2 | 11/2004 | Sezginer et al. | |
| 7,170,604 B2 | 1/2007 | Sezginer et al. | |
| 7,193,715 B2 | 3/2007 | Smedt et al. | |
| 2001/0026975 A1 | 10/2001 | Ando | |
| 2002/0182518 A1 * | 12/2002 | Van Haren | 430/5 |
| 2003/0008472 A1 * | 1/2003 | Yoshimura et al. | 438/400 |
| 2004/0075179 A1 * | 4/2004 | Liu et al. | 257/797 |
| 2006/0024850 A1 | 2/2006 | Monahan et al. | |
| 2006/0223271 A1 | 10/2006 | Hara et al. | |
| 2008/0054359 A1 * | 3/2008 | Yang et al. | 257/351 |
| 2009/0045530 A1 * | 2/2009 | Bucchignano et al. | 257/797 |

* cited by examiner

*Primary Examiner* — Shouxiang Hu
(74) *Attorney, Agent, or Firm* — J.C. Patents

(57) ABSTRACT

The invention is directed to an overlay mark in a first material layer in an overlay alignment region of a wafer and the first material layer is made from a first material. The overlay mark includes a plurality of mark regions and each of the mark regions comprises a plurality mark elements embedded in the first material layer. Each of the mark elements is made of a second material different from the first material of the first material layer and the mark elements evenly distribute in the mark region.

9 Claims, 10 Drawing Sheets

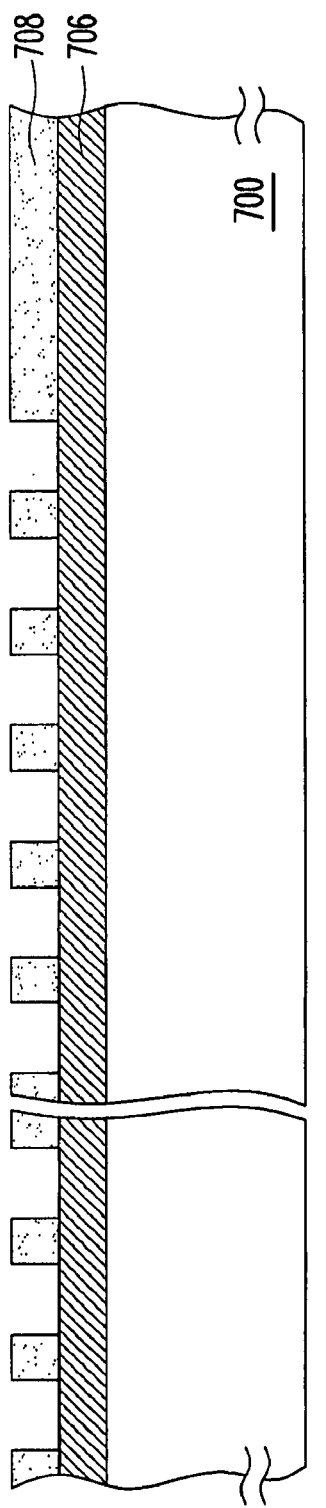
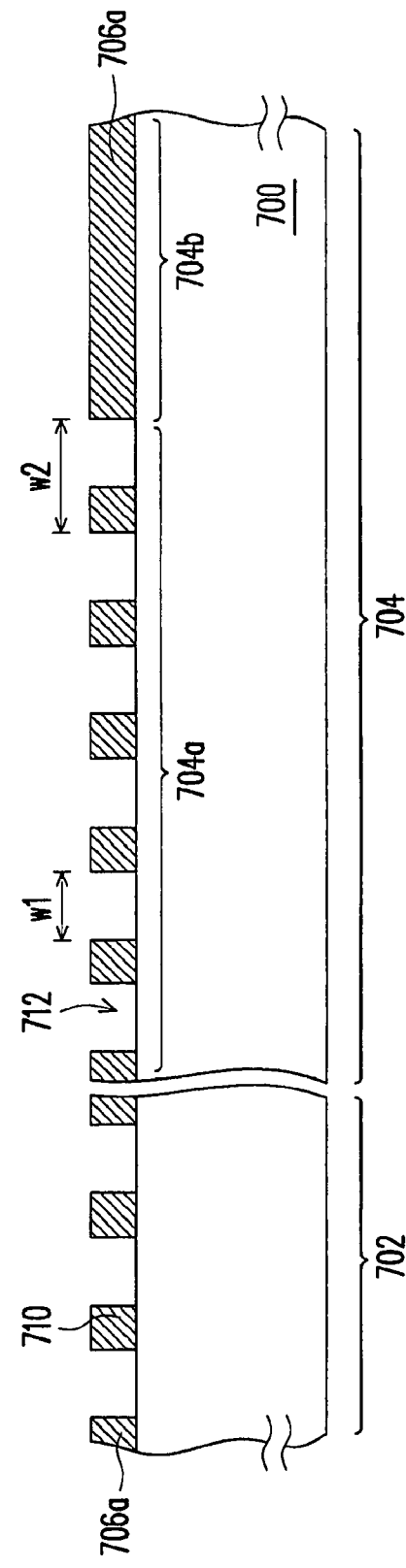
FIG. 7A
FIG. 7B

OVERLAY MARK

BACKGROUND OF THE INVENTION

1. Field of Invention

The present invention relates to an overlay mark and a method for forming the same. More particularly, the present invention relates to an overlay mark with a relatively high contrast comparing to the background and a method for forming the same.

2. Description of Related Art

In the manufacture of integrated circuit, photolithography process is used to transfer patterns from a photo mask having customized circuit patterns to thin films formed on a wafer. The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask. Hence, the image transfer process is accomplished. For a well-manufactured integrated circuit product, the image transfer process mentioned above is performed several times to transfer the circuit patterns to each non-process layers to form the electrically circuit device. Therefore, it is important to align the successive patterned layers to reduce the misalignment errors as the critical dimension of the semiconductor device becomes smaller and smaller.

Typically, the overlay correlation set in an exposure tool is used to insure the alignment precision between the successive patterned layers. That is, after the successive patterned layers are formed, a metrology process for determining the precision of the overlay alignment can be performed by referring to the overlay alignment mark sets of the successive patterned layers. FIG. 1A is a top view showing a wafer with a plurality of device regions thereon. FIG. 1B is an enlarge view of a portion of FIG. 1A for illustrating one of the overlay alignment regions of the wafer shown in FIG. 1A. As shown in FIG. 1A together with FIG. 1B, conventionally, in order to achieve proper overlay alignment, at least one overlay mark 106 is formed at the mark region 104 aside the device region 102 on the wafer 100. For each overlay mark 106, there are several sub-marks 106a. Each sub-mark 106a is composed of a fine frame 108 and an alignment component 110 which is encircled by the fine frame 108. Conventionally, the size of the fine frame 108 is smaller than or equal to the size of the spacer (not shown) formed on the device element (not shown) in the device region 102 at the same material level of the fine frame 108. FIG. 1C is a top view showing an overlay mark in a material layer with another overlay mark of another material layer successively formed on the material layer. FIG. 1D is a spectrum showing image contrasts of the conventional overlay marks shown in FIG. 1C. As shown in FIG. 1C and FIG. 1D, after another material layer 114 with an overlay mark 116 is formed on over the wafer 100, a metrology process for determining the precision of the overlay alignment is performed by referring to the overlay alignment mark sets 106 and 116 of the successive material layers 112 and 114. The contrast between the material layer 114 and the background material layer 112 is sharp/intense (as shown in FIG. 1D). However, the surface area of fine frame 108 is only about 0.1% of the sub-mark 106a for single sub-mark 106a. Therefore, the fine frame 108 contributes to a very low image contrast according to the background material layer 112. That is, it is hardly recognize the sub-mark by referring to the fine frame 108. Hence, the metrology process for determining the precision of the overlay alignment between the material layers 112 and 114 by referring to the over layer marks 106 and 116 is hard to be performed since the intense of the overlay mark 106 is so weak that it is hard to recognize the profile and the mark center of each of the sub-marks 106a of the material layer 112. Therefore, the overlay alignment preciseness for the successive patterned layers is poor.

SUMMARY OF THE INVENTION

Accordingly, the present invention is to provide an overlay mark for enhancing the image contrast between the overlay mark and the background material layer.

The present invention also provides a method for forming an overlay mark capable of improving the overlay alignment preciseness.

To achieve these and other advantages and in accordance with the purpose of the invention, as embodied and broadly described herein, the invention provides an overlay mark in a first material layer in an overlay alignment region of a wafer and the first material layer is made from a first material. The overlay mark includes a plurality of mark regions and each of the mark regions comprises a plurality mark elements embedded in the first material layer. Each of the mark elements is made of a second material different from the first material of the first material layer and the mark elements evenly distribute in the mark region.

According to one embodiment of the present invention, a width of each mark element is about 1~2 times of a thickness of a sidewall spacer. Further, when the width of each trench pattern is about 1~2 times of a thickness of the spacer, a pitch of the mark elements embedded in the first material layer is about 1~2 times of an array pitch and the array pitch includes a pitch of an array of the first material layer in a device region of the wafer. Moreover, the sidewall spacer includes a gate spacer on a device of the first material layer in a device region of the wafer.

According to one embodiment of the present invention, a width of each mark element is about 2.5~3.5 times of a thickness of a sidewall spacer. Further, when the width of each mark element is about 2.5~3.5 times of a thickness of a sidewall spacer, a pitch of the mark elements embedded in the first material layer is about 1~3 times of an array pitch and the array pitch includes a pitch of an array of the first material layer in a device region of the wafer. Also, the sidewall spacer includes a gate spacer of a device of the first material layer in a device region of the wafer.

According to one embodiment of the present invention, a first top surface of each mark elements is at the same height as a second top surface of the first material layer.

According to one embodiment of the present invention, for each mark region, a total surface area of the mark element is 20%~60% of a total surface area of the mark region.

According to one embodiment of the present invention, the mark elements are evenly spaced within the first material layer from each other.

According to one embodiment of the present invention, the mark regions are grouped into at least two groups and the mark regions in the same group are parallel to each other. Further, the mark regions in different groups are perpendicular to each other.

According to one embodiment of the present invention, the mark regions are discretely arranged in the overly alignment region and the mark regions surrounds a central alignment region for arranging an overlay alignment mark set of a second material layer successively formed on the first material layer.

The present invention also provides a method for fabricating an overlay mark over a wafer. The wafer includes at least a device region and at least an overlay alignment region. The method includes the steps of forming a first material layer over the wafer. Then, the first material layer is patterned so that a portion of the first material layer in the device region is transformed into a plurality of device elements and a plurality of trench patterns is formed in a portion of the first material layer in mark regions of the overlay alignment region respectively. A second material layer is formed over the first material layer so as to form a spacer on a sidewall of each of the device elements and fill the trench patterns and the mark regions with the filled trench patterns are defined as an overlay mark.

According to one embodiment of the present invention, a width of each trench pattern is about 1~2 times of a thickness of the spacer. Further, when width of each trench pattern is about 1~2 times of a thickness of the spacer, a pitch of the trench patterns is about 1~2 times of a pitch of the device elements.

According to one embodiment of the present invention, a width of each trench pattern is about 2.5~3.5 times of a thickness of the spacer. Also, when the width of each trench pattern is about 2.5~3.5 times of a thickness of the spacer, a pitch of the trench patterns is about 1~3 times of a pitch of the device elements.

According to one embodiment of the present invention, the device elements include gate strips.

According to one embodiment of the present invention, method further comprises steps of forming a third material layer over the wafer so as to fill gaps between the device elements and performing a planarization process so as to expose a top surface of each device element in the device region and to expose a top surface of the overlay mark and a top surface of a portion of the first material layer in the alignment region.

According to one embodiment of the present invention, for each mark region, a total surface area of the trench patterns is 20%~60% of a total surface area of the mark region.

According to one embodiment of the present invention, for each of the mark region, the trench patterns are evenly spaced from each other.

According to one embodiment of the present invention, the mark regions are grouped into at least two groups and the mark regions in the same group are parallel to each other. In addition, the mark regions in different groups are perpendicular to each other.

According to one embodiment of the present invention, the mark regions are discretely arranged in the overlay alignment region and the mark regions surrounds a central alignment region for arranging an overly alignment mark set of a fourth material layer successively formed on the first material layer.

In the present invention, each mark region of the overlay mark is constructed by several mark elements and the surface area ratio of the surface area of the mark elements to the surface area of the mark region is about 20%~60%. Hence, the image contrast provided by the overlay mark is sharp and the overlay alignment between the stacked material layers is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 7A to 7D are cross-sectional views illustrating a method for forming an overlay mark according to one embodiment of the present invention.

DESCRIPTION OF THE PREFERRED EMBODIMENTS

Figure 1A:
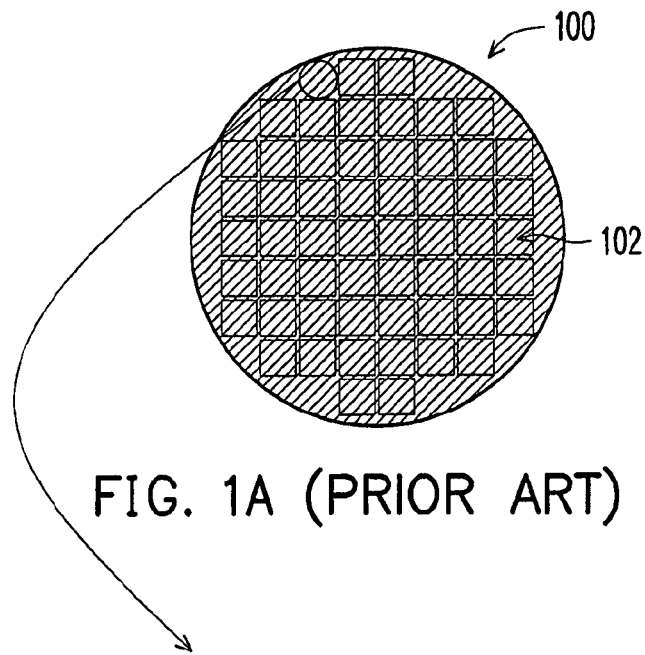
FIG. 1A is a top view showing a wafer with a plurality of device regions thereon.
Figure 1B:
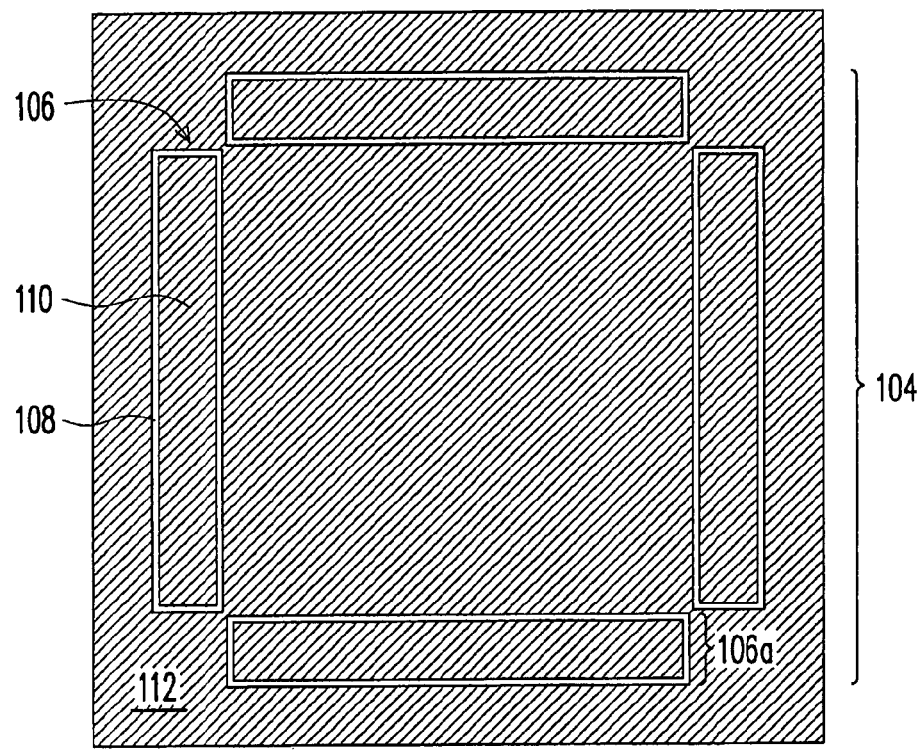
FIG. 1B is an enlarge view of a portion of FIG. 1A for illustrating one of the overlay alignment regions of the wafer shown in FIG. 1A.
Figure 1C:
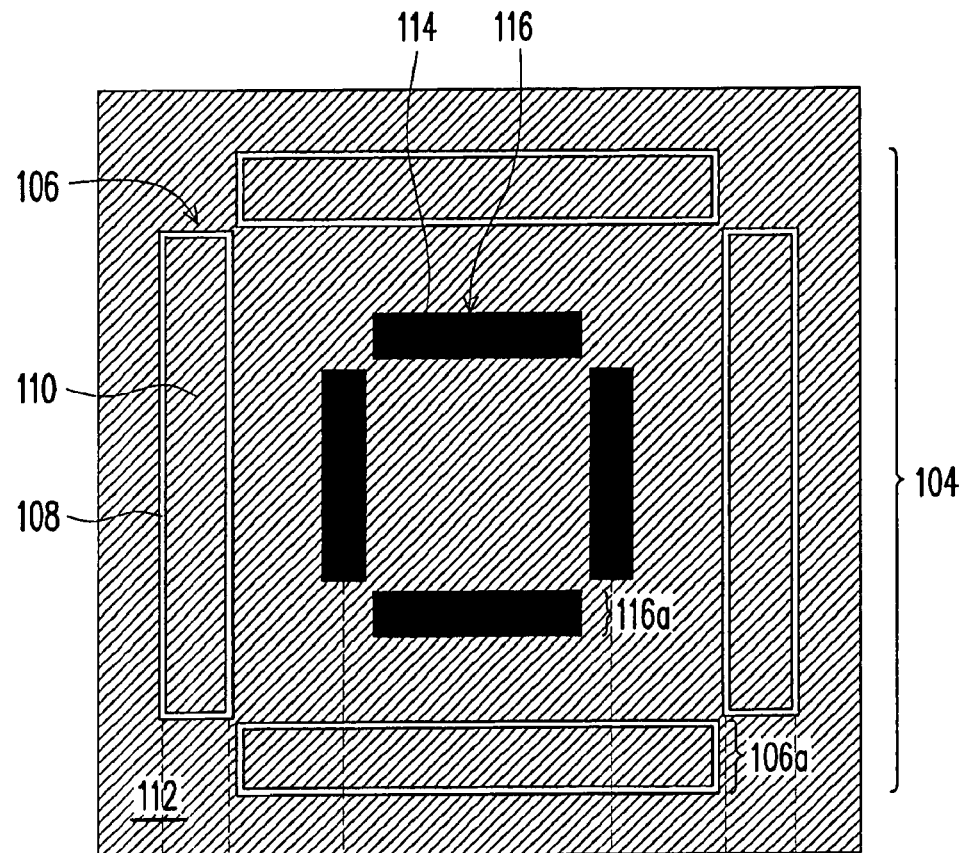
FIG. 1C is a top view showing an overlay mark in a material layer with another overlay mark of another material layer successively formed on the material layer.
Figure 1D:
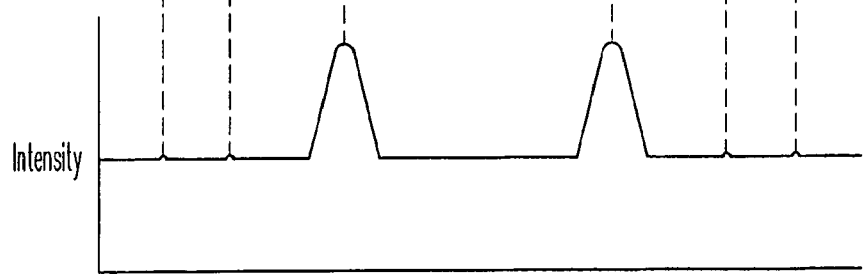
FIG. 1D is a spectrum showing image contrasts of the conventional overlay marks shown in FIG. 1C.
Figure 2A:
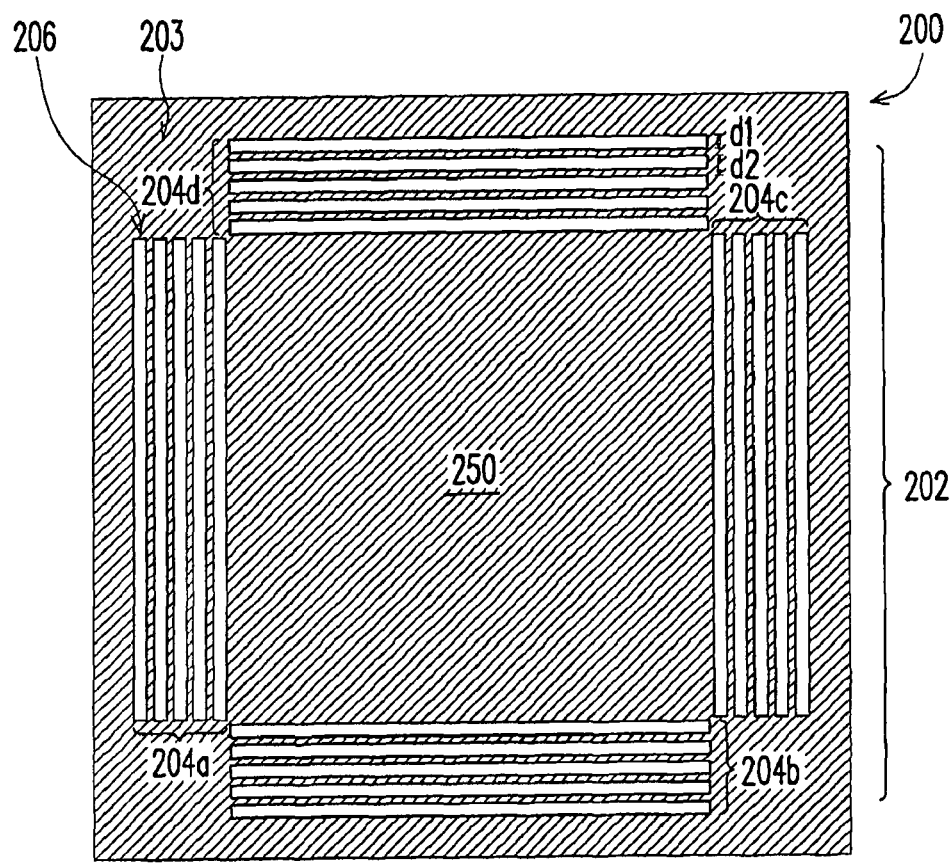
FIG. 2A is a top view schematically illustrating an overlay mark in an overlay alignment region of a wafer according to one embodiment of the present invention.
Figure 2B:
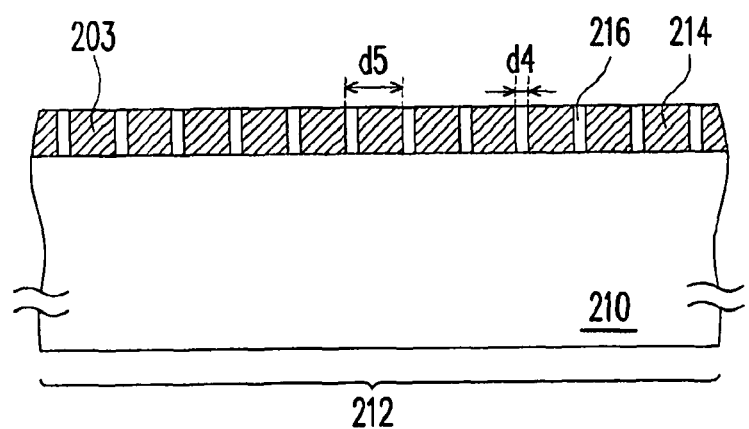
FIG. 2B is a cross-sectional view schematically illustrating a device region of the wafer in FIG. 2A.

FIG. 2A is a top view schematically illustrating an overlay mark in an overlay alignment region of a wafer according to one embodiment of the present invention. FIG. 2B is a cross-sectional view schematically illustrating a device region of the wafer in FIG. 2A. As shown in FIG. 2A together with FIG. 2B, in an overlay alignment region 200 of a wafer 210, there is an overlay mark 202 in a material layer 203 over the wafer 210. The overlay mark 202 comprises several mark regions labeled 204a, 204b, 204c and 204d and each of the mark regions 204a, 204b, 204c and 204d has several mark elements 206.

In the present embodiment, one overlay mark 202 possesses four mark regions, such as mark regions 204a, 204b, 204c and 204d. Furthermore, in the present embodiment, the mark regions 204a, 204b, 204c and 204d are grouped into at least two groups. One group includes mark regions 204a and 204c and the other group includes mark regions 204b and 204d. The mark regions 204a, 204b, 204c and 204d in the same groups are parallel to each other. On the other hand, the mark regions 204a, 204b, 204c and 204d in different groups are perpendicular to each other. Also, the mark regions 204a, 204b, 204c and 204d in the present embodiment are discretely arranged to surround a central alignment region 250. It should be noticed that the central aligmnent region 250 is used to arrange an overlay alignment mark set (not shown) of a later formed material layer thereon. However, the invention is not limited to the numbers and the arrangement of the mark regions mentioned above. It should be noticed that each of the mark elements 206 is made of the material different from that of the material layer 203. In addition, each mark element 206 is embedded in the material layer 203. Furthermore, the top surface of the material layer 203 is at the same height as the top surfaces of the mark elements 206. Moreover, in one embodiment, the mark elements 206 are evenly spaced within the material layer 203 from each other.

Meanwhile, in a device region 212 of the wafer 210, there are several device element 214 made of the material layer 203. In the present embodiment, the device elements 214 can be, for example but not limited to, gate strips. In this embodiment, the material layer 203 can be, for example but not limited to, made of polysilicon or the material practically used for forming the gate in the industrial field. On the other words, the device element 214, made from the material layer 203, is made of polysilicon or the material practically used for forming the gate in the industrial field. In addition, the gate strips in the present embodiment together form a device array. Each of the device elements 214 has a device spacer 216, such as gate spacer, formed on the sidewall thereof. Hence, the material for forming the device spacer 216 can be, for example but not limited to, silicon oxide, silicon nitride, silicon oxynitride or other proper insulating material. It should be noticed that the device spacers 216 can be, for example but not limited to, made of the material as same as those of the mark elements 206 in the mark regions 204$a$, 204$b$, 204$c$ and 204$d$.

Under the circumstance mentioned above, the mark elements 206 of each of the mark regions 204$a$, 204$b$, 204$c$ and 204$d$ is formed in the overlay alignment region 200 at the time the device spacers 216 are formed on the sidewall of the device elements 214 respectively in the device region 212. That is, the device spacers 216 and the mark elements 206 of each of the mark regions 204$a$, 204$b$, 204$c$ and 204$d$ are formed at the same process step. Moreover, the materials of the mark elements 206 are different form the material layer 203.

Further, the width d1 of each mark element 206 perpendicular to the major axis of each mark element 206 can be, for example but not limited to, about 1~2 times of the thickness d4 of the device spacer 216. Also, when the width d1 is about 1~2 times of the thickness of the device spacer 216 in the device region 212, a pitch d2 of the mark elements 206 embedded in the material layer 203 can be, for example but not limited to, about 1~2 times of the pitch d5 of the device array composed of device elements 214.

Accordingly, in the present invention, for each of the mark regions 204$a$, 204$b$, 204$c$ and 204$d$, the total surface area of the mark elements is about 20%~60% of a total surface area of the mark region. Since the sum of the surface areas of the mark elements is about 20%~60% of a total surface area of single mark region for each mark region 206, the image contrast between the mark region 206 and the background, which is the material layer 203 in the overlay alignment region 200, is sharp/intense. Thus, after the later performed photolithography process or a photoresist layer formed over the wafer, the metrology process for determining the precision of the overlay alignment can be performed by referring to the overlay alignment mark with the sharp contrast and the overlay alignment mark set formed within the central alignment region 250. Hence, the overlay alignment performance between the stacked material layers is improved.

Figure 2C:
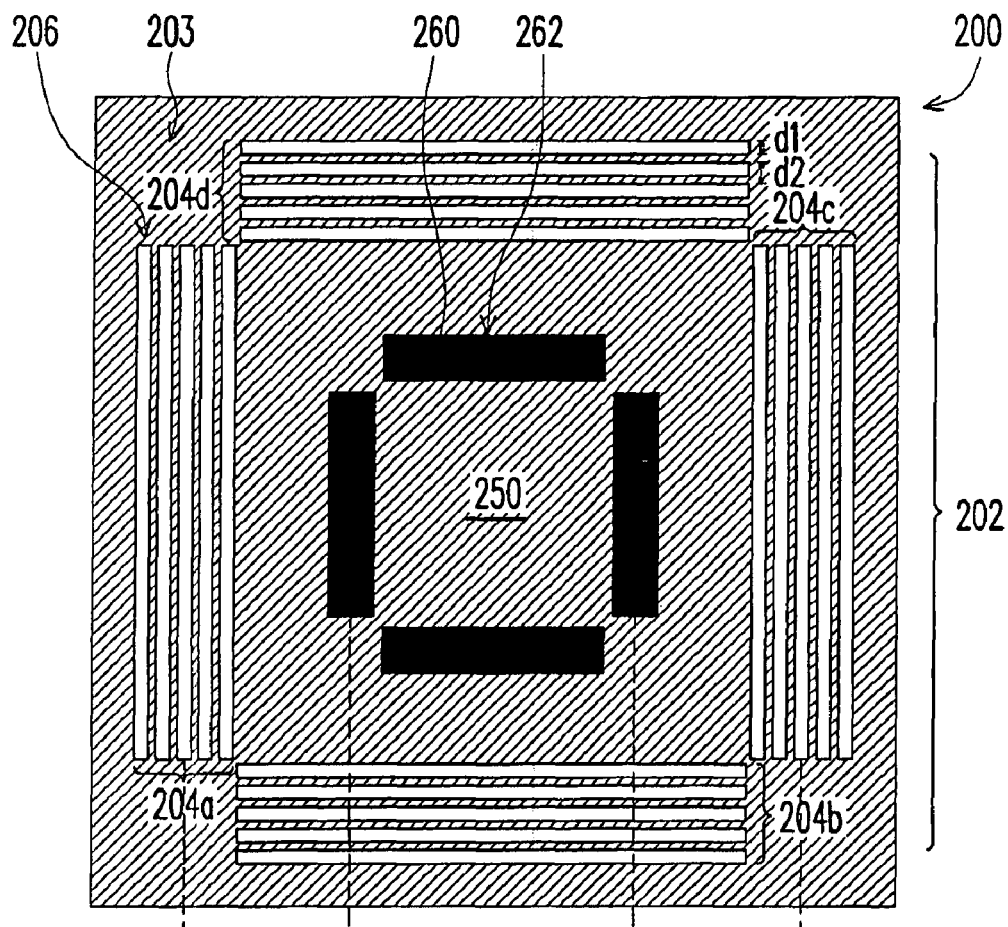
FIG. 2C is a top view showing an overlay mark in a material layer with another overlay mark of another material layer successively formed on the material layer.
Figure 2D:
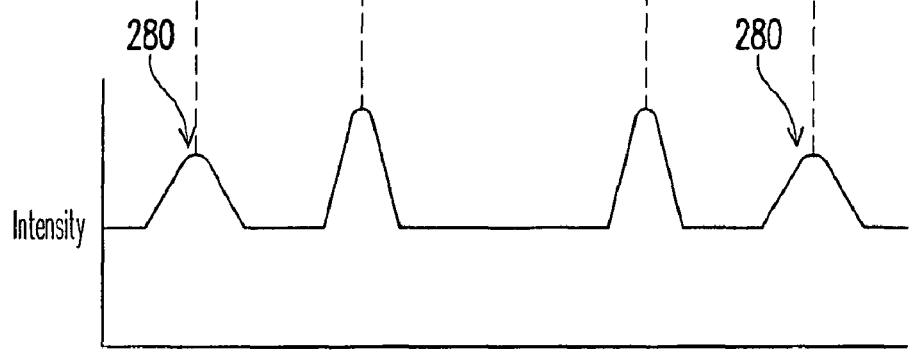
FIG. 2D is a spectrum showing image contrasts of the overlay marks shown in FIG. 2C.

FIG. 2C is a top view showing an overlay mark in a material layer with another overlay mark of another material layer successively formed on the material layer. FIG. 2D is a spectrum showing image contrasts of the conventional overlay marks shown in FIG. 2C. As shown in FIG. 2C and FIG. 2D, in the present invention, for each of mark regions 204$a$, 204$b$, 204$c$, 204$d$, the total surface area of the mark element is about 20%~60% of a total surface area of the mark region. As shown in FIG. 2C, a material layer 260 with an overlay mark 262 is formed over the wafer 210 and the overlay mark 262 is located within the central alignment region 250 surrounded by the. mark regions 204$a$, 204$b$, 204$c$ and 204$d$. Since the total surface area of the mark elements 206 of each of the mark regions of the overlay mark 202 is about 20%~60% of a total surface area of the mark region, the image contrast between each of the mark regions and the background, which is the material layer 203, is sharp/intense (the peaks 280 shown in FIG. 2D). Also, the contrast between the overlay mark 262 and the background material layer 203 is sharp/intense as well. Thus, during the metrology process for determining the precision of the overlay alignment between the successive material layers 203 and 260, it is easy for the optical tool to recognize the profile of each of the alignment regions and to target the mark center of each of the mark regions of the overlay mark 202. Therefore, the overlay alignment performance between successive material layers is improved.

Moreover, in another embodiment, the width d1 can be, for example but not limited to, about 2.5~3.5 times of the thickness of the device spacer 216 in the device region 212 and the pitch d2 of the mark elements 206 embedded in the material layer 203 is preferred to be about 1~3 times of the pitch d5 of the device array composed of device elements 214. Therefore, the total surface area of the mark elements 206 is about 20%~60% of a total surface area of single mark region for each mark region. Similar to the previous embodiment, this kind of structure arrangement provides a sharp contrast between the mark regions and the background material layer 203. Therefore, the overlay alignment performance between the stacked material layers is improved.

Figure 3:
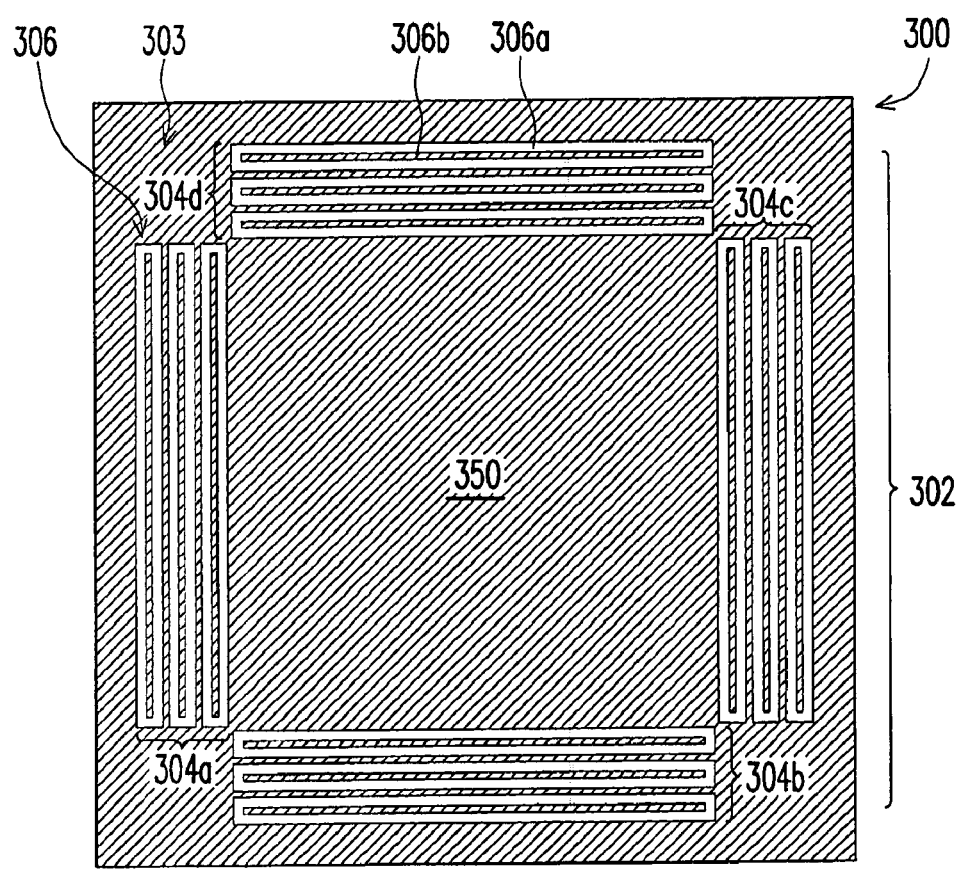
FIG. 3 is a top view schematically illustrating an overlay mark according to another embodiment of the present invention.

In the previous embodiment of the present invention shown in FIG. 2A, for each of the mark regions 204$a$, 204$b$, 204$c$ and 204$d$, each mark element 206 is solid rectangular and the major axis of each mark element 206 is parallel to the major axis of each of the mark regions 204$a$, 204$b$, 204$c$ and 204$d$. However, the type of the mark region of the present invention is not limited to the aforementioned description. FIG. 3 is a top view schematically illustrating an overlay mark according to another embodiment of the present invention. As shown in FIG. 3, in the overlay alignment region 300, each of the mark regions 304$a$, 304$b$, 304$c$ and 304$d$ of the overlay mark 302 has several mark elements 306 and each mark element 306 comprises a frame 306$a$ and an island element 306$b$ encircled by the frame 306$a$. It should be noticed that the frame 306$a$ is made of the material as same as the material for forming the device spacer in the device region of the wafer. That is, at the time the material layer 303 in the device region is patterned to form device element, the portion of the material layer 303 in the overlay alignment region 300 can, for example but not limited to, be also patterned to form the frame trenches and the island elements 306$b$ of the mark elements 306. Therefore, in one embodiment, while the device spacer is formed on the sidewall of the device element, the material layer for forming the device spacer also fills up the frame trenches to be the frame 306$a$. Notably, the total surface area of the frame 306a is about 20%~60% of that of single mark region for each of the mark region 304a, 304b, 304c and 304d.

Figure 4:
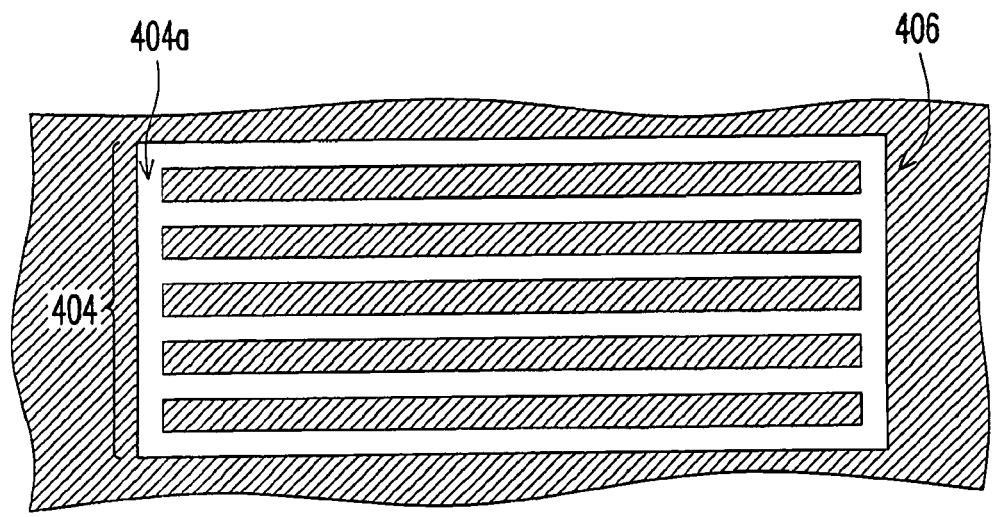
FIG. 4 is a top view schematically illustrating one of mark regions of an overlay mark according to the other embodiment of the present invention.

In the previous embodiments of the present invention, the mark elements of single mark region are discretely arranged and evenly spaced to each other. However, the type and the arrangement of the mark element are not limited by the previous descriptions. FIG. 4 is a top view schematically illustrating one of mark regions of an overlay mark according to the other embodiment of the present invention. In this embodiment, as shown in FIG. 4, in each mark region 404, the mark elements 404a are not discretely arranged and are joined to each other to be a fence type major mark element 406. Notably, the fence type major mark element 406 is made of the material as same as the material for forming the spacer on the sidewall of the device element in the device region of the wafer and the total surface area of the fence type major mark element 406 is about 20%~60% of that of single mark region 404.

Figure 5:
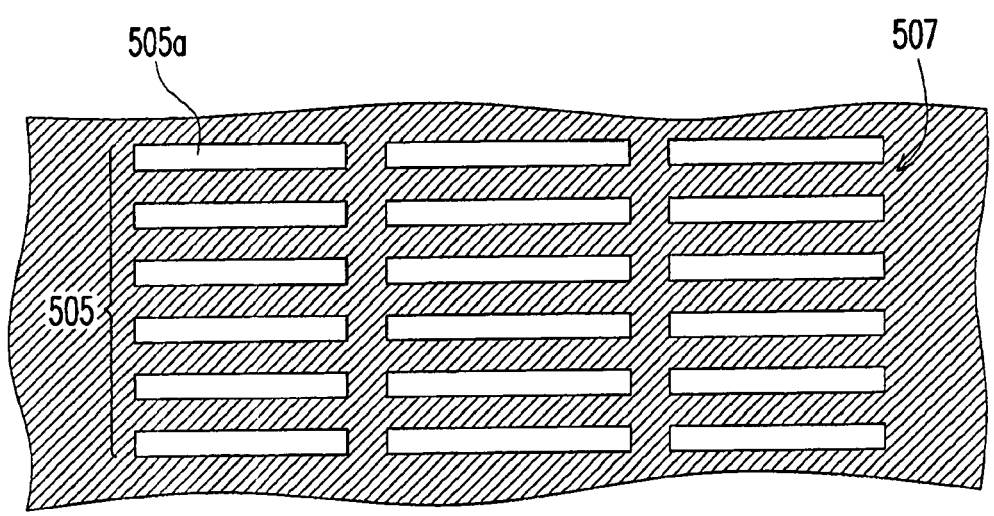
FIG. 5 is a top view schematically illustrating one of mark regions of an overlay mark according to the other embodiment of the present invention.
Figure 6:
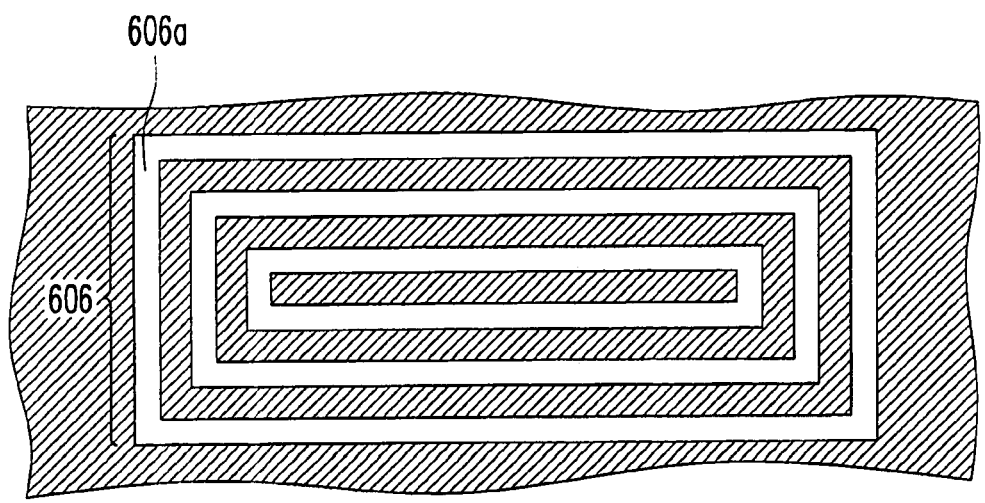
FIG. 6 is a top view schematically illustrating one of mark regions of an overlay mark according to the other embodiment of the present invention.

FIG. 5 is a top view schematically illustrating one of mark regions of an overlay mark according to the other embodiment of the present invention. In this embodiment, as shown in FIG. 5, the mark elements 505a of the mark region 505 is discretely arranged in the mark region 505 and the mark elements 505a together form a mark array 507 in the mark region 505. The total surface area of the mark array 507 is about 20%~60% of the total surface area of single mark region 505 for each of the mark region. FIG. 6 is a top view schematically illustrating one of mark regions of an overlay mark according to the other embodiment of the present invention. In this embodiment, the mark elements 606a are discretely arranged and evenly spaced to each other. Notably, the mark elements 606a encircle one by another and the total surface area of the mark elements 606a is about 20%~60% of the total surface area of single mark region 606 for each of the mark region. According to the previous embodiments, the shapes and the arrangements of the mark elements in single mark region can be varied as long as the total surface of the mark elements is about 20%~60% of that of single mark region for each mark region.

Figure 7C:
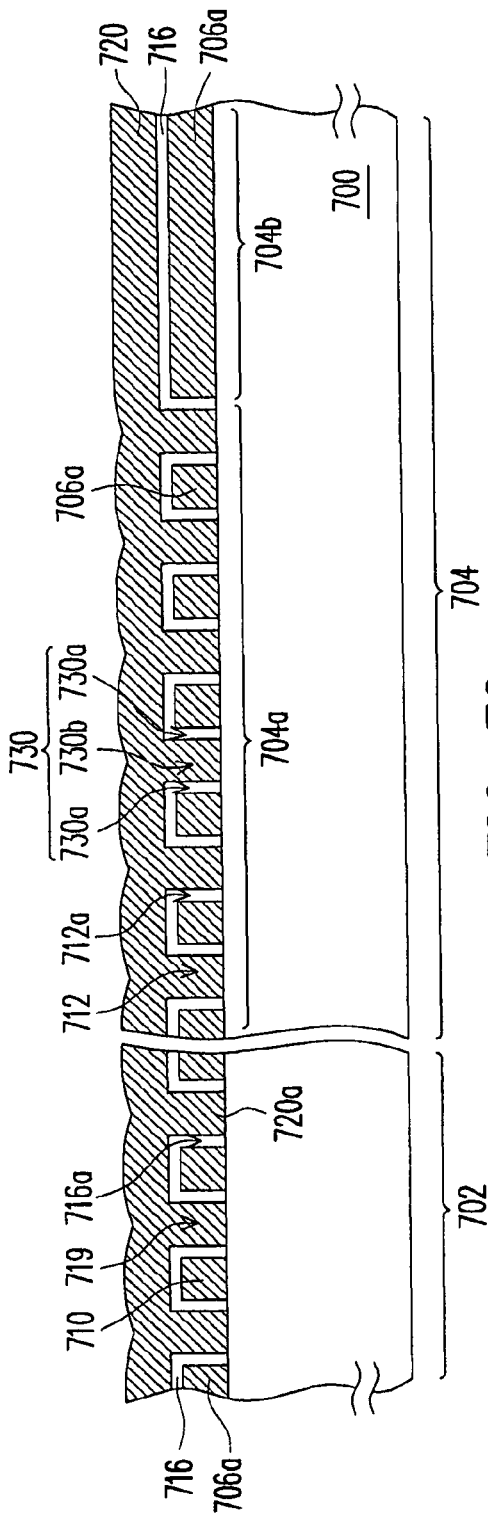

FIGS. 7A to 7D are cross-sectional views illustrating a method for forming an overlay mark according to one embodiment of the present invention. More specifically, the method shown by FIGS. 7A to 7E is used to form an overlay mark similar to the overlay mark shown in FIG. 3. In order to simplify the complexity of the drawings, each of FIGS. 7A, 7B, 7C and 7D only shows one mark region of the overlay mark and a portion of the central alignment region surrounded by the mark regions of the overlay mark in the overlay alignment region. As shown in FIG. 7A, a wafer 700 having at least one device region 702 and at least one overlay alignment region 704 is provided. A plurality of inner connection layers (not shown) is formed on the wafer 700. A first material layer 706 is formed over the wafer 700. The material layer 706 can be, for example but not limited to, made of polysilicon or other material for forming a conductive device such as gate. A patterned photoresist layer 708 is formed on the first material layer 706.

As shown in FIG. 7B, a photolithography process is performed to transfer the pattern of the patterned photoresist layer 708 into the first material layer 706 so that the first material layer 706 is converted into a patterned first material layer 706a. More specifically, a portion of the first material layer 706 in the device region 702 is transformed into device elements 710 and several trench patterns 712 are formed in a portion of the first material layer 706 in the mark region 704a of the overlay alignment region 704. Notably, as shown in FIG. 7B, aside the mark region 704a, there is a central alignment region 704b of the overlay alignment region 704. The device elements 710, in the present embodiment, can be, for example but not limited to, gate strips. In addition, the gate strips in the present embodiment together form a device array. Then, the patterned photoresist layer 708 shown in FIG. 7A is removed.

As shown in FIG. 7C, a second material layer 716 is formed over the first material layer 706a so that a spacer 716a is formed on the sidewall of each of the device elements 710 and on the sidewall of the trench patterns 712. It should be noticed that when the size of opening of the trench pattern 712 is smaller than or equal to twice of the thickness of the spacer 716a, the trench pattern 712 can be filled up with the second material layer 716. Thus, type of the mark element formed under the circumstance aforementioned is similar to the mark elements shown in FIG. 2A. In the embodiment shown in FIG. 7C, the width of each the trench pattern 712 is larger than twice of the thickness of the spacer 716a. Thus, the second material layer 716 only form on the sidewall of each trench pattern 712a as the spacer 712a and the trench patterns 712a are partially filled. The material of the second material layer 716 can be silicon oxide, silicon nitride, silicon oxynitride or other insulating material which is proper for forming a device spacer on the sidewall of the device. Furthermore, if the material of the second material layer 716 is silicon oxide, the method for forming the second material layer 716 can be an oxidation process for directly partially oxidizing the patterned first material layer 706a.

Still referring to FIG. 7C, a third material layer 720 is formed over the wafer 700 so that gaps 719 between the device elements 710 in the device region 702 are filled and the trench patterns 712 are filled up with the third material layer 720 as well. The third material layer 720 can be made of the material as same as the material of the first material layer 706 (shown in FIG. 7A). That is, the third material layer 720 can be, for example but not limited to, made of polysilicon or other conductive material. The portions of the third material layer 720 fills into gaps 719 between the device elements 710 are defined as device elements 720a. Preferably, the size of each device elements 720a is as same as the size of each device elements 710. Thus, as same as the device elements 710, the device elements 720a can be, for example but not limited to, gate strips. Therefore, the device elements 710 and 720a together form the device array. Also, the trench patterns 712a filled with spacer 712a and the third material layer 720 are defined as mark elements 730 respectively. Further, for each of the filled trench pattern 712a, the spacer 712a on the sidewall of the trench pattern 712 is defined as a main frame 730a and the portion of the third material layer 720 filled in the rest of the trench pattern 712 is defined as an island element 730b encircled by the main frame 730a. Moreover, the main frames 730a and the island elements 730b together with the patterned portion of the first material layer 706a at the overlay alignment region 704 are defined as a mark region 704a of the overlay alignment mark.

Figure 7D:
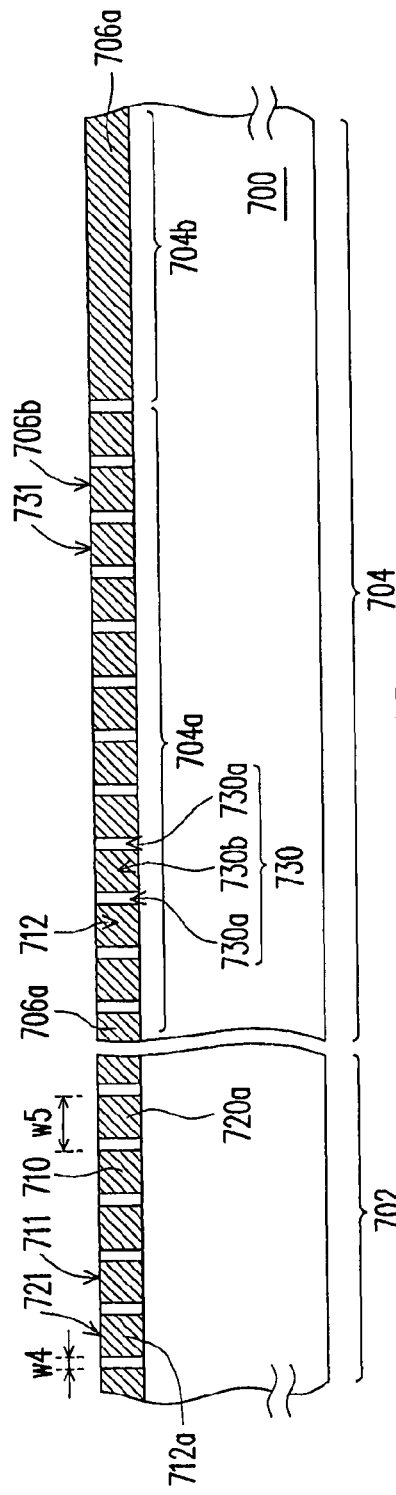
Figure 7E:
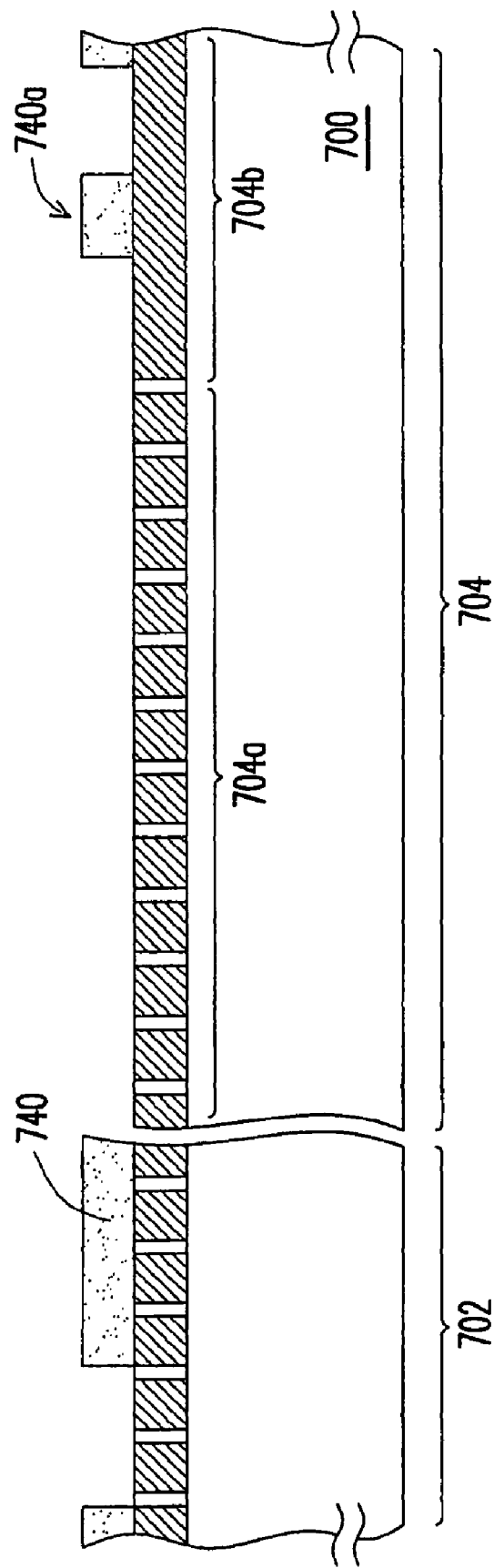
FIG. 7E is cross-sectional view illustrating a successive layer with an overlay alignment mark set formed on the first material layer shown in FIG. 7D.

As shown in FIG. 7D, a planarization process is performed so that the top surfaces 711 and 721 of each of the device elements 710 and 720a in the device region 702 is exposed. Meanwhile, the top surfaces 731 of filled trench patterns 712, that is the island element 730b and the main frame 730a, are exposed and the top surface 706b of a portion of the first material layer 706a in the overlay alignment region 704 is exposed as well. The planarization process can be, for example but not limited to, a chemical mechanical polishing process.

It should be noticed that the width w1 (shown in FIG. 7B) of each trench pattern 712 can be, for example but not limited to, about 2.5~3.5 times of the thickness w4 (shown in FIG. 7D) of the spacer 716a. When the width w1 is about 2.5~3.5 times of the thickness w4 of the spacer 716a in the device region 702, the pitch w2 (shown in FIG. 7B) of the filled trench patter is about 1~3 times of the pitch w5 (shown in FIG. 7D) of the device elements 710 and 720a. Since the width w1 of each trench pattern is about 2.5~3.5 times of the thickness w4 of the spacer 716a in the device region 702, the material for forming the spacer 716a on the sidewall of each device elements 710 can be also formed on the sidewall of the trench patterns 712 as spacers 712a at the time the spacer 716a is formed. Also, for each mark region 704a, the total surface area of the filled trench pattern 712a is about 20%~60% of a total surface area of the mark region 704a. Thus, the image contrast between the mark region 704a and the background, which is the first material layer 706a in the overlay alignment region 704, is sharp. Thus, after the later performed photolithography process or a photoresist layer 740 formed over the wafer 700 as shown FIG. 7E, the metrology process for determining the precision of the overlay alignment between the first material layer 706 and the successive photoresist layer 740 can be performed by referring to the overlay alignment mark with the sharp contrast in the first material layer 706 and the overlay alignment mark set 740a of the photoresist layer 740 formed within the central alignment region 704b. Hence, the overlay alignment performance between the stacked material layers is improved.

Moreover, in another embodiment, the width of each trench pattern 712 can be, for example but not limited to, about 1~2 times of the thickness of the spacer 716a in the device region 702 and the pitch w2 of the filled trench pattern is preferred to be about 1~2 times of the pitch w5 of the device array formed from device elements 710 and 720a. Under dimension requirement aforementioned, the trench pattern 712 can be easily fill up with the second material layer 716 and the result shape of the mark element is similar to the mark element shown in FIG. 2A. Even though the trench pattern is filled up with the second material layer according to the arrangement mention above, the total surface area of the filled trench pattern 712a is still about 20%~60% of a total surface area of single mark region 704a. Similar to the previous embodiment, this kind of overlay alignment mark structure arrangement provides a sharp contrast between the mark region and the background, the first material layer 706a. Therefore, the overlay alignment performance between the stacked material layers is improved.

In the present invention, because the filled trench patterns/mark elements are made of the material different from that of the material layer in which the filled trench patterns/mark elements are embedded and the total surface area of the filled trench patterns/mark elements is about 20%~60% of that of single mark region, the color contrast between the mark region and the back ground which is the material layer is sharp. Thus, the overlay alignment performance by referring to the overlay mark of the present invention is improved. Accordingly, the shape of the mark elements of the mark region in the overlay mark can be varied as long as the total surface of the first element is about 20%~60% of that of single mark region.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An overlay mark in a first material layer made from a first material in an overlay alignment region of a wafer, comprising:
a plurality of mark regions, wherein each of the mark regions comprises:
a plurality of marks embedded in the first material layer in the overlay alignment region, wherein each of the marks is made of a second material of a second material layer in the overlay alignment region, the second material is different from the first material, the marks evenly distribute in the mark region, and the top surface of each mark is at the same height as the top surface of the first material layer in the overlay alignment region, and wherein the first material layer in a device region of the wafer forms a device element and the second material layer in the device region forms a device spacer for the device element.

2. The overlay mark as recited in claim 1, wherein a width of each mark is about 1~2 times of a thickness of the device spacer.

3. The overlay mark as recited in claim 2, wherein a pitch of the marks embedded in the first material layer is about 1~2 times of a pitch of a device array in the device region of the wafer.

4. The overlay mark as recited in claim 1, wherein a width of each mark is about 2.5~3.5 times of a thickness of the device spacer.

5. The overlay mark as recited in claim 4, wherein a pitch of the marks embedded in the first material layer is about 1~3 times of a pitch of a device array in the device region of the wafer.

6. The overlay mark as recited in claim 1, wherein, for each mark region, a total surface area of all the marks is 20%~60% of a total surface area of the mark region.

7. The overlay mark as recited in claim 1, wherein the marks are evenly spaced within the first material layer from each other in each mark region.

8. The overlay mark as recited in claim 1, wherein the mark regions are grouped into at least two groups and the mark regions in the same group are parallel to each other.

9. The overlay mark as recited in claim 1, wherein the mark regions are discretely arranged in the overly alignment region and the mark regions surrounds a central alignment region for arranging an overlay alignment mark set of a third material layer successively formed on the first material layer.

* * * * *